(12) United States Patent  
Landsberger et al.

(10) Patent No.: US 7,465,977 B2  
(45) Date of Patent: Dec. 16, 2008

(54) METHOD FOR PRODUCING A PACKAGED INTEGRATED CIRCUIT

(75) Inventors: Leslie M. Landsberger, Westmount (CA); Oleg Grudin, Montreal (CA)

(73) Assignee: Microbridge Technologies Inc., Montreal (CA)

( * ) Notice: Subject to any disclaimer, the term of this patent is extended or adjusted under 35 U.S.C. 154(b) by 346 days.

(21) Appl. No.: 10/532,627

(22) PCT Filed: Oct. 27, 2003

(86) PCT No.: PCT/CA03/01602

§ 371 (c)(1), (2), (4) Date: Apr. 25, 2005

(87) PCT Pub. No.: WO2004/037712

PCT Pub. Date: May 6, 2004

(65) Prior Publication Data

US 2006/0063292 A1    Mar. 23, 2006

Related U.S. Application Data

(60) Provisional application No. 60/421,088, filed on Oct. 25, 2002.

(51) Int. Cl.
*H01L 21/00* (2006.01)

(52) U.S. Cl. .......................... 257/276; 257/522; 438/12; 438/13; 438/39; 438/40; 438/42; 438/43; 438/44; 438/115; 438/458; 438/459; 438/626; 438/632; 438/633; 438/689; 438/659; 438/940; 438/963; 438/977; 438/690; 438/660; 438/781; 438/799

(58) Field of Classification Search ................. None
See application file for complete search history.

(56) References Cited

U.S. PATENT DOCUMENTS 4,581,928 A * 4/1986 Johnson .................... 73/204.26

(Continued)

FOREIGN PATENT DOCUMENTS

WO    WO02/18785    3/2002  
WO    WO03/023794    3/2003

OTHER PUBLICATIONS

Elderstig H et al: "Spin Deposition on a Polymers Over Holes and Cavities", Sensors and Actuators A. Elsevier Sequola S.A., Lausanne, Switzerland, vol. 46, No. 1-3, Jan. 1995, pp. 95-97.

(Continued)

*Primary Examiner*—David E Graybill  
(74) *Attorney, Agent, or Firm*—Ogilvy Renault LLP

(57) ABSTRACT

There is described a method for producing a packaged integrated circuit. The method comprises a first step of building an integrated circuit having a micro-structure suspended above a micro-cavity, and having a heating element on the micro-structure capable of heating itself and its immediate surroundings. A layer of protective material is then deposited on said micro-structure such that at least a top surface of the micro-structure and an opening of the micro-cavity is covered, wherein the protective material is in a solid state at room temperature and can protect the micro-structure during silicon wafer dicing procedures and subsequent packaging. The integrated circuit is packaged and an electric current is passed through the heating element such that a portion of the protective material is removed and an unobstructed volume is provided above and below the micro-structure.

40 Claims, 5 Drawing Sheets

U.S. PATENT DOCUMENTS

| | | | | |
|---|---|---|---|---|
| 4,867,842 | A * | 9/1989 | Bohrer et al. | 438/53 |
| 6,327,287 | B1 * | 12/2001 | Kner et al. | 372/43.01 |
| 6,379,988 | B1 | 4/2002 | Peterson et al. | |
| 6,669,454 | B2 * | 12/2003 | Lal et al. | 417/410.2 |
| 6,924,176 | B2 * | 8/2005 | Yoshie et al. | 438/132 |
| 2001/0055864 | A1 | 12/2001 | Chan et al. | |
| 2002/0179162 | A1 * | 12/2002 | Lal et al. | 137/828 |

OTHER PUBLICATIONS

Grudin et al., "Microstructure Release and Test Techniques for High-Temperature Micro Hotplate", Electrical and Computer Engineering, 1999, IEEE Canadian Conference on Edmonton, Alberta, CA, May 9-12, 1999, pp. 1610-1615.

* cited by examiner

METHOD FOR PRODUCING A PACKAGED INTEGRATED CIRCUIT

CROSS-REFERENCE TO RELATED APPLICATIONS

The present application claims priorty of U.S. provisional application No. 60/421,088, filed on Oct. 25, 2002.

FIELD OF THE INVENTION

The invention relates to producing a packaged integrated circuit. More specifically, it relates to producing a packaged integrated circuit chip having a micro-structure suspended above a micro-cavity such that the micro-structure is protected during the packaging process.

BACKGROUND OF THE INVENTION

Micro-systems technology includes the making of a variety of micro-structures where the functionality depends on the micro-structure being released from a substrate, and maintaining some physical space around the functional element during operation. This often causes complexity in the packaging processes for such micro-structures, because (a) the micro-structure is usually too fragile to withstand the operation of dicing of the substrate (thus needing some protection during this dicing process), (b) the function of the device needs the maintenance of a cavity around the micro-structure during functional operation (not necessarily during the packaging process), and (c) this cavity may or may not need to be sealed from the outside ambient gas during functional operation. These factors lead to considerable increases in complexity over the simplest (least expensive) chip packaging processes, where the dice (chips) can be simply immersed in plastic packaging material.

The last few steps ("back-end") of such processes must involve, in unspecified order, the creation (release) of the micro-structure, the dicing of the wafer into chips, the affixing of the individual dice to packages and subsequent bonding to the bonding pads, and the closing of the package. The order in which these actions are accomplished is the subject of considerable complexity and investigation among researchers and industrial entities.

In mainstream microelectronics processes, where there are no suspended microstructures, and no cavity needs to be maintained, there are at least two straightforward procedures: (a) finish substrate processing, dice the substrate into individual die (singulate), then bond to the bonding pads and package in injection-molded plastic package; (b) finish substrate processing, deposit and pattern photosensitive material for creation of flip-chip bonding nubs, deposition of bonding nubs, dicing, then bond the chip to its carrier using the bonding nubs.

Methods are being developed for "wafer-level" packaging. These methods involve the affixing of a substrate-sized cover to the wafer at or near the end of the process, whose purposes are to seal a cavity around the micro-structure, as well as to protect the micro-structure during subsequent packaging processes such as dicing. This can work well for subsequent simple plastic packaging. However, a disadvantage is that such a wafer-level cover may be too thick to allow flip-chip bonding, or may be incompatible with flip-chip bonding for other reasons.

Moreover, since it is essential to facilitate the integration of micro-structures and cavities with fabrication processes of mainstream integrated circuits, there is a need to address the problem experienced by the micro-structure during the packaging process.

SUMMARY OF THE INVENTION

Accordingly, an object of the present invention is to facilitate the integration of micro-structures and cavities with the fabrication processes of mainstream integrated circuits, including at least two standard modes of integrated circuit packaging: (a) the simplest and least-expensive plastic packaging processes, and (b) maintenance of a closed cavity in a flip-chip configuration.

According to a first broad aspect of the present invention, there is provided a method for producing a packaged integrated circuit, the method comprising: building an integrated circuit having at least one micro-structure suspended above a micro-cavity and having a heating element on the at least one micro-structure capable of heating itself and its immediate surroundings; depositing a layer of protective material on the micro-structure such that at least a top surface of the micro-structure and an opening of the micro-cavity is covered, wherein the protective material is in a solid state at room temperature and can protect the micro-structure during silicon wafer dicing procedures and subsequent packaging, and wherein the micro-structure, the micro-cavity, and the protective material provide an unobstructed volume above and below the micro-structure after the micro-structure is subjected to a heat source; packaging the integrated circuit; and passing an electric current through the heating element to generate the heat source to provide the unobstructed volume above and below the micro-structure.

Preferably, the protective material fills the entire micro-cavity and heating the heating element creates a bubble (gaseous or vacuum) around the micro-structure that provides the space needed below and above the micro-structure.

Also preferably, the protective material is photosensitive and can be used for patterning of flip-chip bonding nubs or other patterning purposes. The protective material may be deposited as a liquid, as long as it later becomes a solid at room temperature, perhaps as a result of further processing (such as baking).

Additionally, injection molding may be used such that a plastic layer completely covers the chip and the protective material.

Also additionally, there can be several micro-structures suspended over a single cavity in the substrate. In this case, heaters on the several microstructures are used to create a common cavity in which all of the micro-structures can reside (and interact, if necessary). This can be done by creating separate cavities by separate heating events, in such a way that the cavities overlap, creating a single cavity, or it can be done by simultaneously heating several heaters.

According to a second broad aspect of the present invention, there is provided a system for producing an integrated circuit, the system comprising: a substrate having at least one micro-structure suspended above a micro-cavity and having a heating element on the at least one micro-structure capable of heating itself and its immediate surroundings; a layer of protective material on the micro-structure such that at least a top surface of the micro-structure and an opening of the micro-cavity is covered, wherein the protective material is in a solid state at room temperature and can protect the micro-structure during silicon wafer dicing procedures and subsequent packaging, and wherein the micro-structure, the micro-cavity, and the protective material provide an unobstructed volume above and below the micro-structure when the micro-structure is subjected to a heat source; and heating circuitry for passing an electric current through the heating element to generate the heat source to provide the unobstructed volume above and below the micro-structure.

The heating circuitry may be provided on-chip or off-chip in order to provide the unobstructed volume above and below the micro-structure.

According to a third broad aspect of the invention, there is provided a packaged integrated circuit comprising: a substrate having at least one micro-structure suspended above a micro-cavity; a packaging enclosing the substrate; a protective layer of material substantially filling the packaging, wherein the protective material is in a solid state at room temperature and can protect the micro-structure during silicon wafer dicing procedures and subsequent packaging; and an unobstructed volume above the micro-structure and below the micro-structure to provide the micro-cavity.

BRIEF DESCRIPTION OF THE DRAWINGS

These and other features, aspects and advantages of the present invention will become better understood with regard to the following description and accompanying drawings wherein.

DETAILED DESCRIPTION OF THE PREFERRED EMBODIMENT

Figure 1:
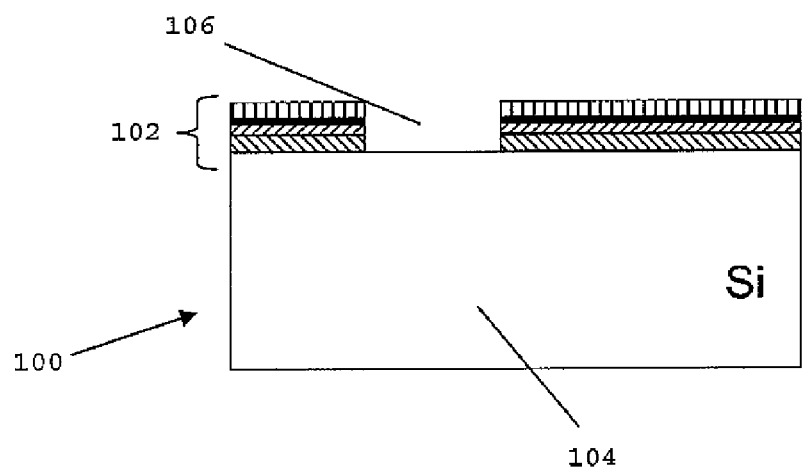
FIG. 1 is a cross sectional view of patterned surface layers on a silicon substrate according to the prior art.

Throughout this application, the term packaging is to be understood as a process comprising connecting the integrated circuit (IC) to the bonding pads and mounting it into an environment for its end-use.

The present invention addresses the problem of packaging complexity for micro-structures and their cavities, by using a layer of material, which acts to protect the micro-structure during dicing, and which also is suitable for subsequent creation of a micro-cavity within its bulk, by heating from the micro-structure itself. If this layer is further photosensitive, then it can be simultaneously for both of the above purposes as well as for patterning of flip-chip bonding nubs (bumps) or other patterning purposes.

To enable this invention, the specific material used for the protective layer needs to be suitable for deposition to a thickness of at least several microns, and needs to be suitable for creation of a cavity within its bulk by heating to an elevated temperature (for example 250° C. or above). It needs to be able to be deposited and reach a stable state as a solid at room temperature without damaging fragile released micro-structures within its bulk or underneath its bottom surface. In this solid state, it needs to be robust enough to protect the micro-structure during silicon wafer dicing procedures and subsequent packaging, which may involve forceful water cleaning and moving silicon fragments. The protective material may be deposited as a liquid, as long as it becomes solid and has these properties during subsequent dicing.

There are several reactions that may occur when the protective material is burned away. The reaction products of the burning could stay as a gas, forcing the stretching of the protective material into a bubble-like configuration, visible in the overall shape of the protective material. The reaction products of the burning could be absorbed into the protective material, causing little or no deformation of the overall outer shape of the protective material. A portion of the protective material could undergo a phase change resulting in a higher density than the remaining solid portion and thus simply retract.

Also, the micro-structure contains a heating element, suitable to heat itself and its immediate surroundings, in order to "burn" the cavity within the protective material. This "burning" involves a chemical reaction or phase transition within the protective material, initiated by the heat from the micro-structure. This may involve the creation of gaseous and solid reaction products in he cavity, which may or may not be absorbed into the protective material. Thus, in some cases, the creation of the cavity may generate a change (increase or decrease) in pressure or volume, which may be accommodated by mechanical changes in (e.g. expansion, retraction, stretching) of the surrounding material. These mechanical effects may exert forces on any packaging material outside the protective layer. Furthermore, the heat may result in direct modification of the structural properties of the solid surrounding the created cavity, such as shrinking or expanding, or stiffening. Such changes in properties may or may not compensate for any additional pressure or volume generated by the cavity reaction.

Therefore, depending on the composition of the protective layer, gas pressure may be generated in the cavity either lower or higher than the surrounding ambient gas pressure, which can be important for certain applications.

By using more complex materials as protective layers, certain advantages can be realized. For example, if a porous material (containing pre-formed micro-voids or nano-voids within its bulk) were used, this could facilitate the burning of the cavity without any macroscopic deformation of the protective layer. In this case, reaction products of the burning would more easily dissipate among adjacent voids in unburned portions of the layer, without stretching the overall protective layer. This could be implemented by forming a polymer or an adhesive substance (e.g. epoxy), in a porous (or foamed) state, prior to or during deposition on the substrate.

FIGS. 1-4 show a typical process to create the functional micro-structure inside a cavity embedded in a protective layer on top of a silicon substrate.

FIG. 1 shows a cross-section of a simple structure 100 with patterned surface layers 102 on a silicon substrate 104. The surface layers 102 are patterned such that an area of open silicon 106 is exposed. This would be the state at the end of a mainstream silicon process, for example a CMOS process.

The silicon would still be in the form of a silicon wafer (not yet diced), at this point in the process. Bonding pads (not shown) at the periphery of the chip, could also be exposed at this stage of the process.

Figure 2:
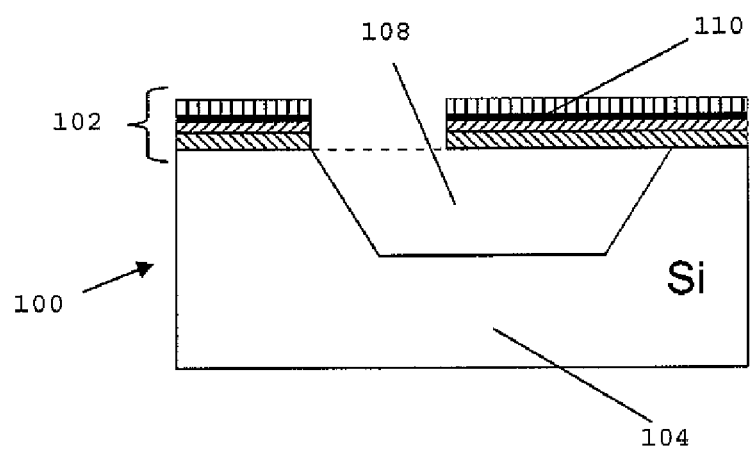
FIG. 2 is the structure of FIG. 1 with a cavity etched into the substrate underneath a portion of the patterned surface layers according to the prior art. The cavity with surface layers suspended over it comprises the micro-structure.

FIG. 2 shows the same simple structure 100 after etching of a cavity 108 underneath a portion of the patterned surface layers 102. The patterned surface layers 102 suspended over the cavity 108 constitute the "suspended micro-structure" 110. Intricacies of the process of etching the cavity are known to a person skilled in the art.

Figure 3:
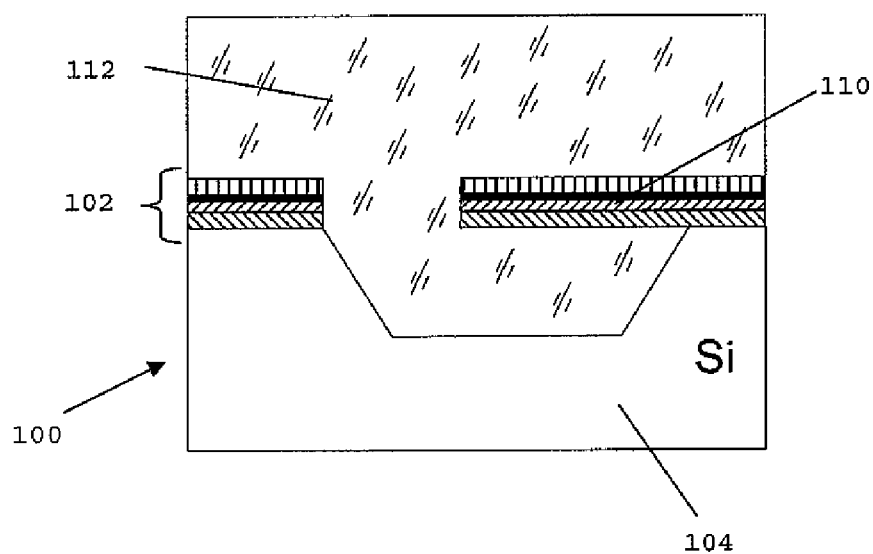
FIG. 3 is the structure of FIG. 2 with a protective material applied.

FIG. 3 shows the same structure after application of a protective layer 112. The protective layer 112 must be applied in a sufficient thickness tat it can accommodate a cavity 108 of sufficient thickness for the function of the device which involves the micro-structure. (This cavity could have vertical dimensions in the range of a few microns to tens of microns or more.) In FIG. 3 the protective layer 112 fills the entire cavity 108, including directly beneath the suspended microstructure 110. Next, the substrate can be singulated into dice (chips), and electrical contacts to the chip can be realized. This realization can be accomplished by bonding of wires to exposed bonding pads, which would need to have been exposed by patterning the protective layer, likely before dicing.

Figure 4:
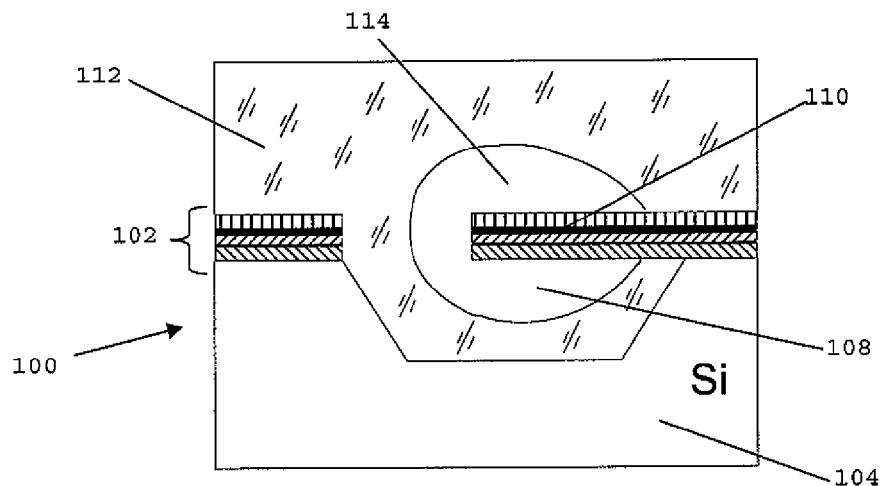
FIG. 4 is the structure of FIG. 3 after a cavity has been created within the protective material by heating a heating element within the surface layers suspended over the substrate cavity.

FIG. 4 shows the same structure 100, (now intended to represent a micro-structure on a single chip instead of on a wafer full of such structures), where the cavity 108 has been created within the protective layer 112. The cavity 108 has been created by heating from a heat source on the micro-structure 110 itself The heating has caused the creation of a bubble 114 within the hulk of the protective layer 112, both above and below the micro-structure 110. The heating may have been accomplished by passing an electric current (via the electrical contacts) through an electrically resistive element situated within the suspended micro-structure 110. The dissipation of electric power in the resistive element could raise the temperature of the micro-structure 110 high enough that it melts or bums or, in general causes a phase change, the adjacent protective material 112 to create the cavity 108.

In the case where the entire micro-cavity 108 is filled with the protective material 112, as seen in FIG. 3, the protective material must be capable of shrinking away from the micro-structure 110 when subjected to the heat generated from the micro-structure 110. This shrinking preferably occurs as a result of the material 112 being porous and the burned portions of the material 112 dissipating within adjacent voids in the unburned portion of the material. Alternatively, the shrinking can occur as a result of a restructuring of the molecules making up the material 112. When the material 112 is subjected to heat, the restructuring causes the material 112 to retract into a smaller volume.

Figure 5:
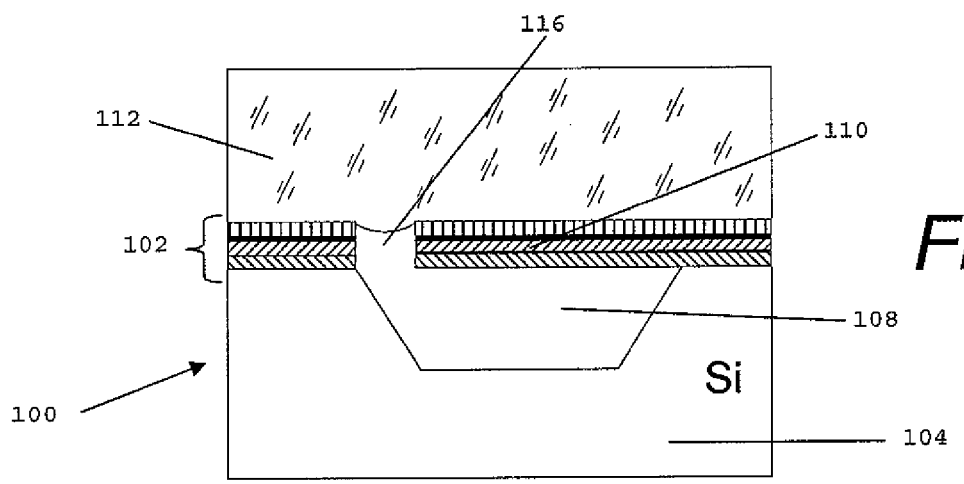
FIG. 5 is the structure of FIG. 2 with a protective material applied, where the protective material has not flowed into the cavity in the silicon underneath the surface layers.
Figure 6:
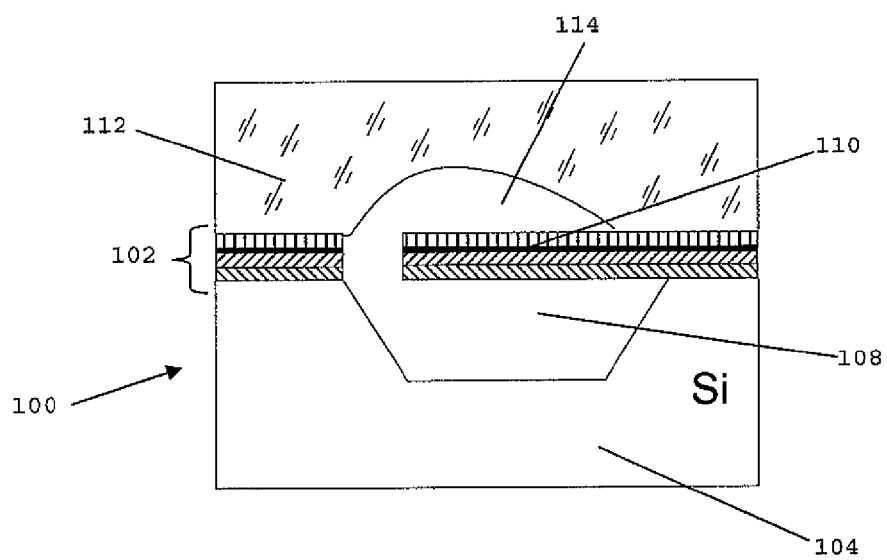
FIG. 6 is the structure of FIG. 5 after a cavity has been created within the protective layer by heating the heating element within the surface layers.

Several variations of material deposition and cavity geometry are possible. For example, FIG. 5 shows the case where the protective layer 112 applied does not completely fill the cavity 108 underneath the micro-structure 110. This case could occur, for example, if the protective layer 112 were deposited as a liquid with a high surface tension or high viscosity, and if The opening 116 to the cavity 108 underneath the micro-structure 110 were too small for rapid flow of the liquid. In this case, the heating could enhance the cavity 108 by extending it above the micro-structure 110, again creating an appropriate cavity 108 for functional operation of the micro-structure 110, as shown in FIG. 6.

In cases where the micro-cavity 108 is not filled by the protective material 112 as can be seen in FIG. 5, the material 112 may undergo a phase change and turn into gas, thereby deforming the rest of the material 112 as a result of the gas pressure. If the gas pressure is strong enough and the packaging cannot withstand the added stress, the entire packaging may become deformed as a result of the phase change. If the packaging can withstand the tension due to the gas pressure, no visible change to the packaging will occur and only the material 112 within the packaging will be deformed. This type of reaction may also occur when the micro-cavity 108 is filled by the protective material 112,as seen in FIG.3.

In the case where a vacuum is formed within the unobstructed volume, The material 112 may undergo a change that will cause it to solidify and remain solid during subsequent operation of the chip. Alternatively, the material 112 may be softened subsequently as a result of further heating due to standard operation of the device, thereby causing the material to collapse back down onto or near to the micro-structure 110. Further heating of the micro-structure 110 may then recreate the unobstructed volume 114 above and below the micro-structure.

Figure 7:
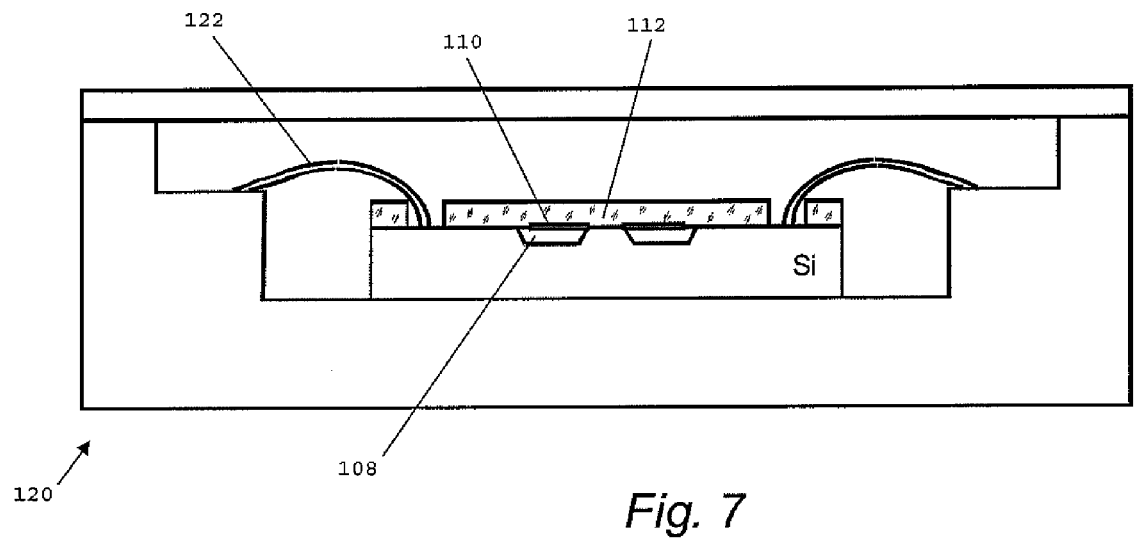
FIG. 7 is a schematic of a chip with structures such as shown in FIG. 3 or 5, in a typical discrete package with a cap.

FIG. 7 shows a schematic of a chip 120, in a typical packaged and bonded configuration, prior to creation of the cavity 108. The cavity 108 can then be created within the protective material 112 by applying electrical signals through the bonding wires 122.

Figure 8:
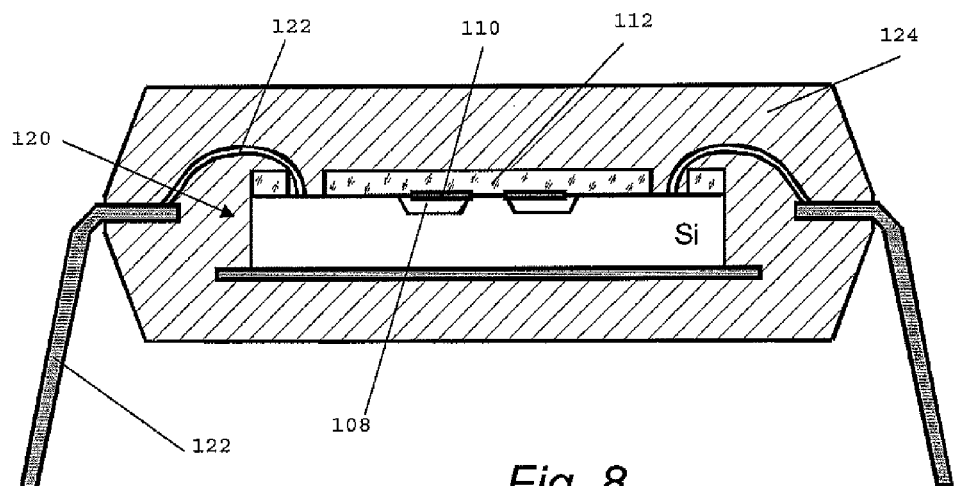
FIG. 8 is a schematic of a chip with structures such as shown in FIG. 3 or 5, packaged by injection molded plastic after attaching the bonding wires.

FIG. 8 shows how such a chip 120 with protected micro-structures 110 could be embedded within an injection-molded plastic package 124. The bonding wires 122 extend through the plastic 124 to make contact with external electric circuitry.

An example of material for the protective layer 112 is polymer materials, which can often be applied or deposited as a liquid and readily baked until it becomes suitably solid. Also, such materials are largely composed of the elements carbon, oxygen, and hydrogen, suitable for creation of the cavity 108 by burning (due to the heat).

Figure 9:
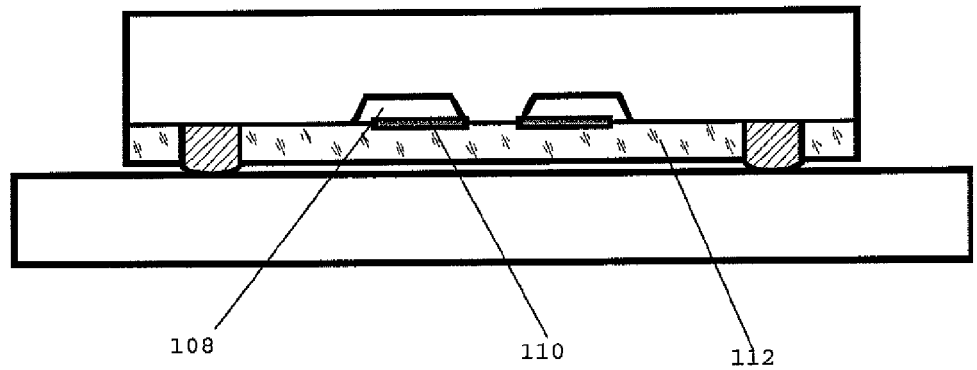
FIG. 9 is a schematic of a chip with structures such as shown in FIG. 3 or 5, attached to a carrier in a flip-chip configuration.

A further example of material for the protective layer 112 is photosensitive material such as photoresist, where it could simultaneously perform addition function(s) in the processing of the device, such as for patterning of flip-chip nubs. This configuration is shown in FIG. 9, where the material 112 protecting the micro-structures 110 is the same photo-sensitive material that was used to pattern the nubs. As in FIG. 7, the device shown in FIG. 9 is ready for creation of the cavity 108 by applying electrical power signals.

A further requirement on the protective material 112 is as follows. If it is applied as a liquid (or liquid with a high surface tension) prior to solidification, it must not shrink or expand during solidification such that it damages the micro-structure 110.

It is known from Patent Application Publication Number WO03023794, co-pending by applicant and incorporated herein by reference, to place an element on a micro-structure for the purpose of trimming. The method of the present invention can be particularly useful when used to protect an electrically-trimmable resistor during packaging when that resistor is placed on a micro-structure. If the device consists of a micro-structure suspended over a cavity in the substrate and one or more heater elements embedded in the surface layers comprising that suspended micro-structure, and if the trimming is accomplished by using one heater to heat another electrically resistive element on the same or closely adjacent microstructure designed over the same cavity, then the same heating signals used to perform the first trimming operation after the packaging is complete, can serve to create the cavity.

It can also be used with a variety of other devices where a cavity is required to be preserved after packaging. For example it can be used in the case where the micro-structure is a micro-resonator, and where one provides an auxiliary heater on the micro-structure in order to create the cavity after packaging. In this case, the material of the protective layer may be designed to leave a reduced pressure in the cavity after cavity creation.

Another important example is any sensor based on micro-thermal elements, such as a thermal accelerometer based on displacement of a heated air mass over thermally-sensitive micro-structures inside a closed cavity. In this case, it may be advantageous for the residual pressure and/or density of the gas in the cavity to be greater than atmospheric pressure.

Note also that there can be several micro-structures suspended over a single cavity in the substrate. In this case, one can use heaters on the several microstructures to create a common cavity in which all of the micro-structures can reside (and interact, if necessary). This can be done by creating separate cavities by separate heating events, in such a way that the cavities overlap creating a single cavity, or it can be done by simultaneously heating several heaters.

The protective material could also be made from transparent material—and thus could work as a glass cover for a micro-bolometer, or other optical device.

The protective material could also be an adhesive substance, and simultaneously serve to directly connect the chip to another object.

Standard CMOS silicon technology was used to create cantilever-shaped micro-structures having dimensions 50 µm×80 µm, each containing a functional resistor and an auxiliary heater. While still before dicing, the cantilevers were released by etching the silicon in tetra-methyl ammonium hydroxide (TMAH). Then, negative photoresist (type SC-900) was manually brushed (deposited) on the wafer. The wafer was then baked at 120° C. for 20 minutes and then diced. Then, individual dice were epoxied to a chip-package and wire-bonded to the bonding pads at the periphery of the chip. The chips were then ready for electrical testing.

Figure 10:
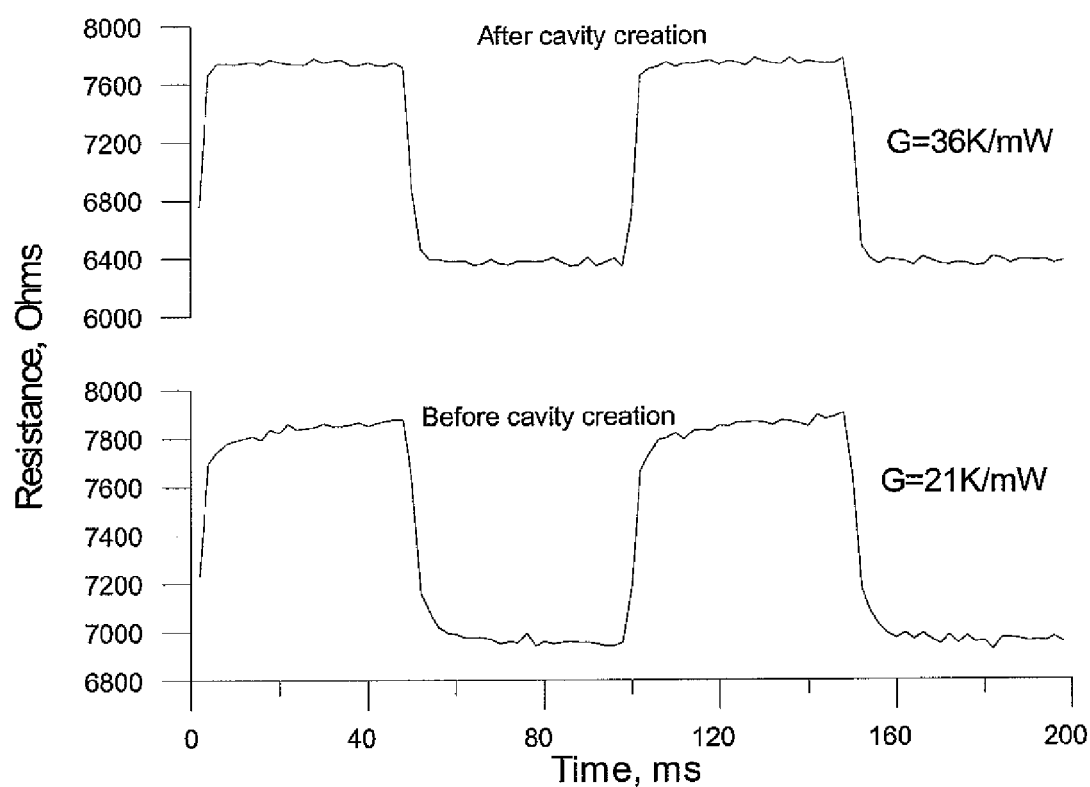
FIG. 10 is a graph of resistance versus time before and after cavity creation.

Pulses having duration 50 ms were applied to the heater, and the resistance of the functional resistor was measured as a function of time. FIG. 10 (lower curve, before cavity creation) shows the behavior of the functional resistor when the heater-power was applied. The overheating temperature was estimated at approximately 100° C. This temperature does not create a cavity, and in this case the thermal isolation of the cantilever-shaped micro-structure was estimated to be approximately G=21 K/mW. Then higher power levels were applied to the heater, heating the functional resistor to a temperature substantially above 500° C., in order to create (burn or melt) the cavity in the protective material surrounding the micro-structure. After cavity creation, the same 50 ms, 9.5 mW pulses were applied to the heater, and the resulting waveform is shown in the upper curve (after cavity creation) in FIG. 10. In this case, the thermal isolation has increased to approximately G=36 K/mW. Furthermore, comparison of time responses of the resistor before and after cavity creation indicates substantial reduction of thermal inertia of the suspended micro-structure after creation of the cavity.

These two observations confirm that the protective material has receded from the micro-structure. This value of thermal isolation (36 K/mW) is somewhat lower than that found for the same structure without any layer of protective material (~50 K/mW). After creation of the cavity, inspection of the structure by optical microscope showed that a bubble had formed around the part of the micro-structure containing the heater.

After the above treatment, the functional resistor's resistance was trimmed and recovered several times. Its resistance was adjusted from an initial value of 7.3 kΩ to 5.5-6.0 kΩ. After each trimming, the resistance of the functional resistor was recovered to 6.5-6.7 kΩ. The time response of the functional resistor was measured again at the same levels of dissipated power, and found to be unchanged from that seen in the upper curve of FIG. 10. This indicates that the cavity created in the photoresist by heating the micro-structure is suitable to allow trimming of a heat-trimmable resistor.

Another experimental structure tested involved three separate micro-structures all suspended over the same cavity in the substrate, having an inter-element distance approximately 50 µm. By sequentially heating each of these micro-structures, a common cavity was created in the protective material, in which resided all three suspended micro-structures.

Figure 11:
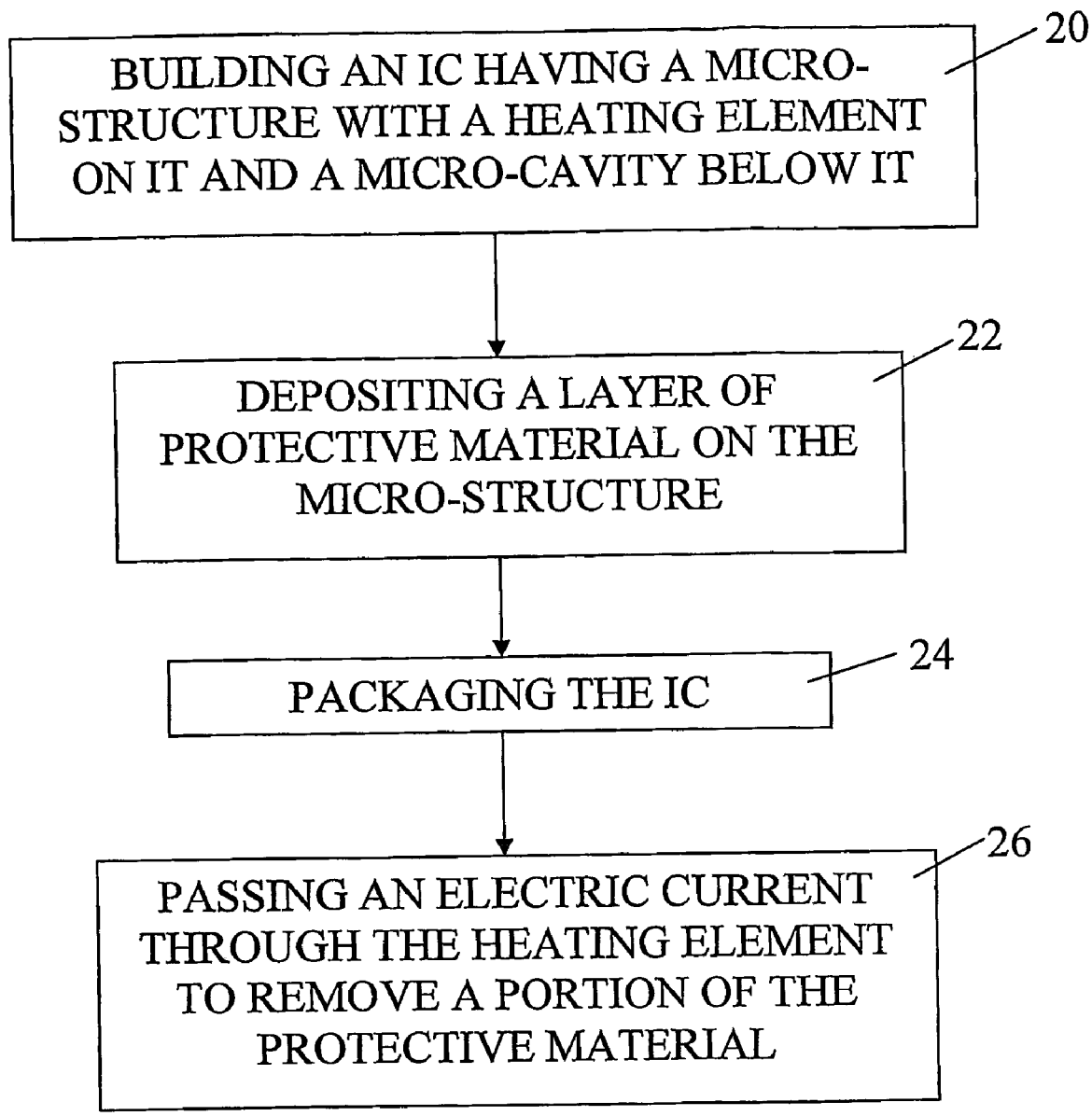
FIG. 11 is a flowchart of the method according to the present invention.

FIG. 11 is a flow chart showing the steps of the method according to the present invention. The first step is to build an integrated circuit having a micro-structure with a heating element on it and a micro-cavity below it 20. A layer of protective material is then deposited on the micro-structure and at least the opening of the cavity is covered, as well as the micro-structure 22. The protective material is in a solid state at room temperature and can protect the micro-structure during silicon wafer dicing procedures and subsequent packaging. The micro-structure, the micro-cavity, and the protective material provide an unobstructed volume above and below the micro-structure after the micro-structure is subjected to a heat source. The integrated circuit is then packaged 24. An electric current is then passed through the heating element to provide the unobstructed volume above and below the micro-structure 26.

As stated above, the micro-structure can comprise a trimmable resistor which can be trimmed by the electric current passed through the heating element. Alternatively, the trimmable resistor may itself be a heating element, and therefore the electric current is applied directly to the trimmable resistor in order to both trim it, and create the unobstructed volume above and below the micro-structure.

According to the method of the present invention, the protective layer can be deposited as a photosensitive material, a material that is initially a liquid and becomes solid at room temperature, and/or a porous material.

Accordingly, the present invention is also for providing a packaged integrated circuit. The integrated circuit comprises a substrate having at least one micro-structure suspended above a micro-cavity, a packaging enclosing the substrate, a protective layer as described above, and an unobstructed volume above and below the micro-structure to provide the micro-cavity. While the preferred embodiment comprises providing the micro-cavity above and below the micro-structure using heat, it should also be appreciated that the micro-cavity may be provided in alternate ways. For example, should a protective layer of high surface tension be applied to the micro-structure while the substrate is in a pressurized environment, a subsequent change in the ambient pressure (as for example caused by placing the substrate in a vacuum chamber) could then cause a bubble to form above the micro-structure, thereby providing the unobstructed volume above and below the micro-structure if the protective material is capable of deforming as a result of the gas pressure.

The protective material may be a liquid that becomes solid at room temperature, a photosensitive material, a porous material, a foamed material, an epoxy-based material, or any combination thereof.

While the present invention is used for providing an unobstructed volume above and below a micro-structure, it can be appreciated that it can also be used to provide an unobstructed volume above a heating element when the heating element resides directly on a substrate, should the substrate be covered by a protective material for dicing and packaging.

It will be understood that numerous modifications thereto will appear to those skilled in the art. Accordingly, the above description and accompanying drawings should be taken as illustrative of the invention and not in a limiting sense. It will further be understood that it is intended to cover any variations, uses, or adaptations of the invention following, in general, the principles of the invention and including such departures from the present disclosure as come within known or customary practice within the art to which the invention pertains and as may be applied to the essential features herein before set forth, and as follows in the scope of the appended claims.

The invention claimed is:

1. A method for producing a packaged integrated circuit, the method comprising:
   building an integrated circuit having at least one micro-structure suspended above a micro-cavity and having a heating element on said at least one micro-structure capable of heating itself and its immediate surroundings;
   depositing a layer of protective material on said micro-structure such that at least a top surface of said micro-structure and an opening of said micro-cavity is covered, wherein said protective material is in a solid state at room temperature and can protect said micro-structure during silicon wafer dicing procedures and subsequent packaging, and wherein said micro-structure, said micro-cavity, and said protective material provide an unobstructed volume above and below said micro-structure after said micro-structure is subjected to a heat source;
   packaging said integrated circuit; and
   passing an electric current through said heating element to generate said heat source to provide said unobstructed volume above and below said micro-structure.

2. A method as claimed in claim 1, wherein said building an integrated circuit comprises providing a trimmable resistor on said micro-structure, and wherein said trimmable resistor is trimmed by said passing an electric current through said heating element.

3. A method as claimed in claim 2, wherein said trimmable resistor is said heating element, and said electric current is applied directly to said trimmable resistor.

4. A method as claimed in claim 1, wherein said depositing a layer of protective material comprises depositing a liquid material that becomes solid at room temperature.

5. A method as claimed in claim 1, wherein said depositing a layer of protective material comprises depositing a photosensitive material.

6. A method as claimed in claim 1, wherein said depositing a layer of protective material comprises depositing a foamed material.

7. A method as claimed in claim 1, wherein said depositing a layer of protective material comprises depositing a material that will shrink away from said micro-structure when receiving heat from said micro-structure as a result of said micro-structure being subjected to said heat source.

8. A method as claimed in claim 7, wherein said depositing a material that will shrink comprises depositing a porous material, and wherein a burned portion of said material dissipates among adjacent voids in unburned portions of said protective material.

9. A method as claimed in claim 8, wherein said porous material is epoxy based.

10. A method as claimed in claim 1, wherein said depositing a layer of protective material comprises depositing a material that will deform in response to gas pressure from a portion of said material becoming gaseous as a result of said micro-structure being subjected to said heat.

11. A method as claimed in claim 10, wherein said depositing a layer of protective material comprises depositing a material that has a high surface tension, such that said micro-cavity remains unfilled by said material.

12. A method as claimed in claim 1, wherein said building an integrated circuit comprises providing a micro-resonator as said micro-structure.

13. A method as claimed in claim 1, wherein building an integrated circuit comprises providing a plurality of micro-structures suspended above said micro-cavity.

14. A method as claimed in claim 13, wherein each of said plurality of micro-structures has a heating element residing thereon and said passing an electric current comprises passing an electric current through said heating element on each of said plurality of microstructures.

15. A method as claimed in claim 14, wherein said passing an electric current through said heating element comprises passing an electric current simultaneously through said heating element on each of said plurality of micro-structures.

16. A system for producing an integrated circuit, said system comprising:
   a substrate having at least one micro-structure suspended above a micro-cavity and having a heating element on said at least one micro-structure capable of heating itself and its immediate surroundings;
   a layer of protective material on said micro-structure such that at least a top surface of said micro-structure and an opening of said micro-cavity is covered, wherein said protective material is in a solid state at room temperature and can protect the micro-structure during silicon wafer dicing procedures and subsequent packaging, and wherein said micro-structure, said micro-cavity, and said protective material provide an unobstructed volume above and below said micro-structure when said micro-structure is subjected to a heat source; and
   heating circuitry for passing an electric current through said heating element to generate said heat source to provide said unobstructed volume above and below said micro-structure.

17. A system as claimed in claim 16, wherein said micro-structure comprises a trimmable resistor thereon, and said trimmable resistor can be trimmed by said passing an electric current through said heating element.

18. A system as claimed in claim 17, wherein said trimmable resistor is said heating element, and said electric current is applied directly to said trimmable resistor.

19. A system as claimed in claim 16, wherein said layer of protective material is a photosensitive material.

20. A system as claimed in claim 16, wherein said layer of protective material is a foamed material.

21. A system as claimed in claim 16, wherein said layer of protective material is a material that will shrink away from said micro-structure when receiving heat from said micro-structure as a result of said micro-structure being subjected to said heat source.

22. A system as claimed in claim 21, wherein said material that will shrink is a porous material, and wherein a burned portion of said material dissipates among adjacent voids in unburned portions of said protective material.

23. A system as claimed in claim 22, wherein said porous material is epoxy based.

24. A system as claimed in claim 16, wherein said layer of protective material is a material that will deform in response to gas pressure from a portion of said material becoming gaseous as a result of said micro-structure being subjected to said heat.

25. A system as claimed in claim 24, wherein said a layer of protective material has a high surface tension, such that said micro-cavity remains unfilled by said material.

26. A system as claimed in claim 16, wherein said micro-structure is a micro-resonator.

27. A system as claimed in claim 16, wherein said substrate comprises a plurality of micro-structures suspended above said micro-cavity.

28. A system as claimed in claim 27, wherein each of said plurality of micro-structures has a heating element residing thereon and said heating circuitry is for passing an electric current through said heating element on each of said plurality of micro-structures.

29. A system as claimed in claim 28, wherein said heating circuitry is for passing an electric current simultaneously through said heating element on each of said plurality of micro-structures.

30. A system as claimed in claim 16, wherein said heating circuitry is off-chip.

31. A packaged integrated circuit comprising:
a substrate having at least one micro-structure suspended above a micro-cavity and a heating element on said micro-structure capable of heating itself and its immediate surroundings;
a packaging enclosing said substrate;
a protective layer of material filling said packaging, wherein said protective material is in a solid state at room temperature and can protect said micro-structure during silicon wafer dicing procedures and subsequent packaging;
an unobstructed volume above said micro-structure and below said micro-structure to provide said micro-cavity; and
heating circuitry for passing an electric current through said heating element to generate a heat source to provide said unobstructed volume above and below said micro-structure.

32. A packaged integrated circuit as claimed in claim 31, wherein said protective layer of material is a photosensitive material.

33. A packaged integrated circuit as claimed in claim 31, wherein said protective layer of material is a porous material.

34. A packaged integrated circuit as claimed in claim 31, wherein said protective layer of material is a foamed material.

35. A packaged integrated circuit as claimed in claim 31, wherein said micro-structure comprises a trimmable resistor thereon, and said trimmable resistor can be trimmed by said electric current passed through said heating element.

36. A packaged integrated circuit as claimed in claim 35, wherein said trimmable resistor is said heating element, and said electric current is applied directly to said trimmable resistor.

37. A packaged integrated circuit as claimed in claim 31, wherein said substrate comprises a plurality of micro-structures suspended above said micro-cavity.

38. A packaged integrated circuit as claimed in claim 31, wherein said substrate comprises a plurality of micro-structures suspended above said micro-cavity.

39. A packaged integrated circuit as claimed in claim 38, wherein each of said plurality of micro-structures has a heating element residing thereon and said heating circuitry is for passing an electric current through said heating element on each of said plurality of micro-structures.

40. A packaged integrated circuit as claimed in claim 39, wherein said heating circuitry is for passing an electric current simultaneously through said heating element on each of said plurality of micro-structures.

* * * * *